United States Patent [19]

Zumoto et al.

[11] Patent Number: 4,879,473

[45] Date of Patent: Nov. 7, 1989

[54] ELECTRON-BEAM EXPOSURE APPARATUS

[75] Inventors: Nobuyuki Zumoto; Masahiko Sakamoto; Susumu Hoshinouchi, all of Hyogo, Japan

[73] Assignee: Mitsubishi Denki Kabushiki Kaisha, Tokyo, Japan

[21] Appl. No.: 248,071

[22] Filed: Sep. 23, 1988

[30] Foreign Application Priority Data

Sep. 25, 1987 [JP] Japan .................................. 62-238636

[51] Int. Cl.$^4$ ............................................. H01J 37/00
[52] U.S. Cl. ............................. 250/492.2; 250/492.3; 250/310; 250/396 R; 364/571.04
[58] Field of Search ............. 250/492.2, 492.22, 492.3, 250/492.1, 396 R, 306, 310; 364/571.04, 571.05, 571.06

[56] References Cited

U.S. PATENT DOCUMENTS

| | | | |
|---|---|---|---|
| 4,420,691 | 12/1983 | Zasio | 250/492.2 |
| 4,583,298 | 4/1986 | Raugh | 33/1 R |
| 4,593,200 | 6/1986 | McGuire, III | 250/492.21 |
| 4,607,333 | 8/1986 | Yasutake et al. | 250/492.2 |
| 4,692,579 | 9/1987 | Saitou et al. | 250/492.2 |
| 4,763,004 | 8/1988 | Yasuda et al. | 250/396 R |

FOREIGN PATENT DOCUMENTS

| | | | |
|---|---|---|---|
| 0115952 | 8/1984 | European Pat. Off. | 364/571.04 |
| 0005955 | 1/1983 | Japan | 250/396 R |
| 0245133 | 12/1985 | Japan | 250/492.2 |
| 0049419 | 3/1986 | Japan | 250/492.2 |
| 0229743 | 10/1987 | Japan | 250/396 R |
| 0095623 | 4/1988 | Japan | 250/492.2 |

OTHER PUBLICATIONS

Asai et al, "Distortion Correction and Deflection Calibration by Means of Laser Interferometry in an Electron-beam Exposure System," J. Vac. Sci. Technol., 16(6) Nov./Dec. 1979, pp. 1710-1714.

Primary Examiner—Janice A. Howell
Assistant Examiner—John A. Miller
Attorney, Agent, or Firm—Sughrue, Mion, Zinn, Macpeak and Seas

[57] ABSTRACT

An electron-beam exposure apparatus having a correction function for correcting deflection distortion. The correction function is carried out by the provision of a correcting device including an analog correction unit 35 and a digital correction unit having a memory unit 10 for storing correction data other than data that can be expressed by a cubic function. The capacity of such a memory unit can be made smaller than that of conventional apparatuses.

3 Claims, 3 Drawing Sheets

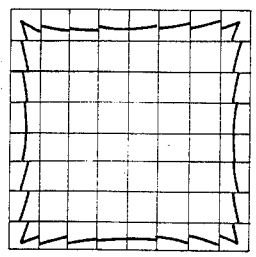
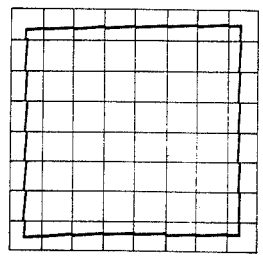
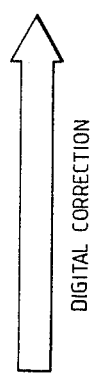
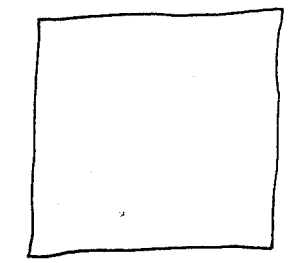
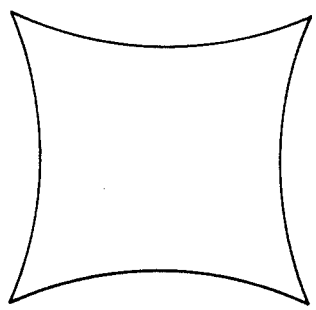
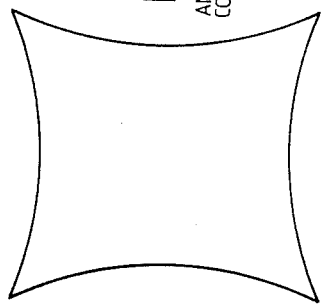
FIG. 3(A)
FIG. 3(B)

ELECTRON-BEAM EXPOSURE APPARATUS

BACKGROUND OF THE INVENTION

1. Field of the Invention

The present invention relates to an electron-beam exposure apparatus for exposing a printed substrate and the like by the use of an electron-beam. More particularly, the invention relates to an electron-beam exposure apparatus provided with a correction device for correcting deflection distortion which is capable of being constructed economically using a memory device of relatively small capacity.

2. Description of Prior Art

FIG. 1 is a schematic diagram showing a correction device for correcting deflection distortion occurring in conventional electron-beam exposure apparatuses, as disclosed in Japanese Kokai No. 113168/1977. In FIG. 1, reference numeral 10 designates a correction data storing unit for storing data necessary to correct the deflection distortion, and reference numerals 11 and 12 designate data lines for data representing beam positions in the X-axis and Y-axis directions, respectively. The data lines 11 and 12 are connected to either a pattern data storing unit or a pattern data generating unit (not shown). The correction data storing unit 10 is coupled to the X-data line 11 and Y-data line 12 through data lines 13 and 14 for X-address bits and Y-address bits, respectively. The correction data storing unit 10 is also coupled to an X-adder 17 and a Y-adder 18 through an X-correction data output line 15 and a Y-correction data output line 16. In the X-adder 17, the X-correction data is added to the beam position data in the X-axis direction. On the other hand, the Y-correction data is added to the beam position data in the Y-axis direction in the Y-adder 18. The digital outputs of the X-adder 17 and the Y-adder 18 are applied to D/A converters 19 and 20, respectively, to be converted into analog data. A main deflection coil 12 deflects the electron-beam in the X-axis direction according to the output of the D/A converter 19, whereas a main deflection coil 22 deflects the electron-beam in the Y-axis direction according to the output of the D/A converter 20.

The operation of the conventional apparatus will be described with reference to FIG. 1 and FIG. 3(A).

The beam position data which are supplied through the data lines 11 and 12 from either the pattern data storing unit or the pattern data generating unit (not shown), have an accuracy of N-bits in each of the X-axis and Y-axis directions. A deflection area is equally divided by $2^n$ (n is positive integer satisfying $n<N$) in both the X and Y directions to thereby obtain lattice pattern points of $(2^n+1)\times(2^n+1)$ as shown in FIG. 3(A). The correction data are measured at these correction data measurement (lattice pattern) points and then correction data of $2^n\times 2^n$ is obtained by deleting one column and one line in each of the X and Y directions, voluntarily. The correction data $2^n\times 2^n$ are stored in the correction data storing unit 10. In deflecting the electron-beam, the correction data which have been stored in the correction data storing unit 10 are applied through the data output lines 15 and 16 to the X-adder 17 and the Y-adder 18, respectively, where the X-correction and Y-correction data are added to the X and Y position data to carry out digital correction. The outputs of the X-adder 17 and Y-adder 18 are subjected to D/A conversion in the D/A converters 19 and 20. Thereafter, the thus obtained analog outputs are applied to the main deflection coils 21 and 22 so as to correct the actual position of the electron-beam. In this case, in order to improve the correction accuracy, it has been proposed to increase the number of correction data measurement (lattice pattern) points in the deflection area, i.e., increase the above described "n" to thereby make the division rate finer.

To make it easy to understand the correction operation, a concrete example is where n=3, that is the division rate is $2^3=8$, the division rate being relatively rough, is shown in FIG. 3(A). The left part of FIG. 3(A) illustrates a square electron-beam pattern that is affected by deflection distortion. As shown in FIG. 3(A), the square electron-beam pattern is distorted at the center of each edge like a bobbin. The distortion is measured at the measurement points to be applied to the respective adders 17 and 18 so that the correction is accomplished by subtracting a value corresponding to the distortion from data representing a reference square pattern not distorted. The corrected pattern is as shown in the right part of FIG. 3(A). The corrected pattern is obtained by subjecting the data for each of the measurement points to correction based on the X-correction data and Y-correction data, and therefore the deflection distortion between the adjacent measurement points remains without correction.

With such a conventional apparatus as constructed above, all of correction data are stored in the correction data storing unit 10, and an actual pattern including deflection distortion is subjected to correction in a digital mode. It should be noted that the bobbin-shaped deflection distortion as shown in FIG. 3(A) occurs most frequently, and such a bobbin-shaped figure can be expressed as a cubic function. Accordingly, it is unnecessary to store the correction data for the bobbin-shaped distortion in the correction data storing unit in advance. In other words, while the provision of a cubic-function processing function enables the apparatus to prepare the correction signals with respect to distortions that can be expressed by a cubic function, without the data having to be provisionally stored in the storing unit the memory capacity is nevertheless increased. However, as mentioned above, all of data including the correction data for the bobbin-shaped distortion for instance are stored in the storing unit. To this end, in the case of exposing a printed substance in which deflections having large amplitudes may occur, the correction values becomes larger than those in exposing an ordinary wafer by the use of the conventional apparatus. Accordingly, in order to maintain accuracy in the exposure, it is indispensable to increase the number of measurement points for the correction data, as a result of which the apparatus is made complicated and the manufacturing cost is thus increased.

SUMMARY OF THE INVENTION

In view of the above, the present invention is accomplished to eliminate drawbacks accompanying the conventional apparatus, and thus an object of the present invention is to provide an electron-beam exposure apparatus in which digital correction with respect to beam-position data is combined with analog correction with respect to beam-position data after being subjected to digital-to-analog conversion, thereby resulting in decreasing the number of measuring points so as to reduce the storage capacity of a correction data storing unit and to make the apparatus simple in construction.

The above, and other objects of the present invention are accomplished by the provision of an electron-beam exposure apparatus which comprises a correction data storing unit for storing correction data other than data that can be expressed by a cubic function, an adding unit for adding the correction data from the storing unit to beam position data in both the X- and Y-axis directions; a digital-to-analog converting unit for subjecting output signals from the adder unit to digital-to-analog conversion; and an analog arithmetic operation unit for subjecting outputs from the digital-to-analog converting unit to analog correction according to either a deflection correction control signal or a cubic-function processing function provided to the arithmetic unit.

BRIEF DESCRIPTION OF THE DRAWINGS

In the accompanying drawings:

FIG. 3(A) is a diagram showing correction results obtained by the conventional apparatus and FIG. 3(B) is also a diagram showing correction results obtained by an apparatus according to the present invention.

DESCRIPTION OF PREFERRED EMBODIMENT

Figure 1:
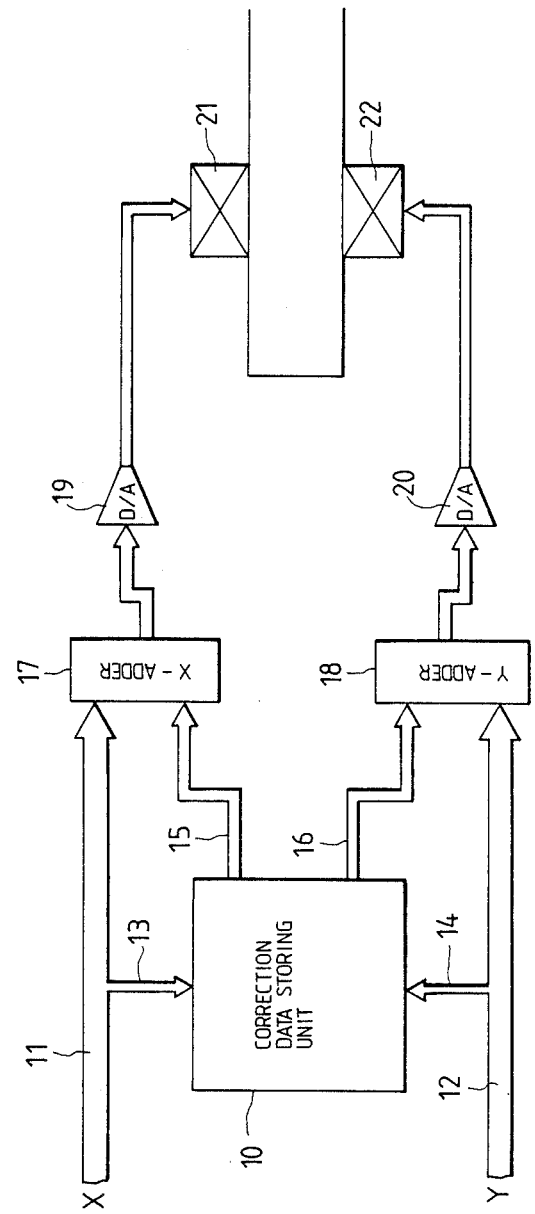
FIG. 1 is a schematic diagram showing an example of a deflection distortion correction device in a conventional electron-beam exposure apparatus.
Figure 2:
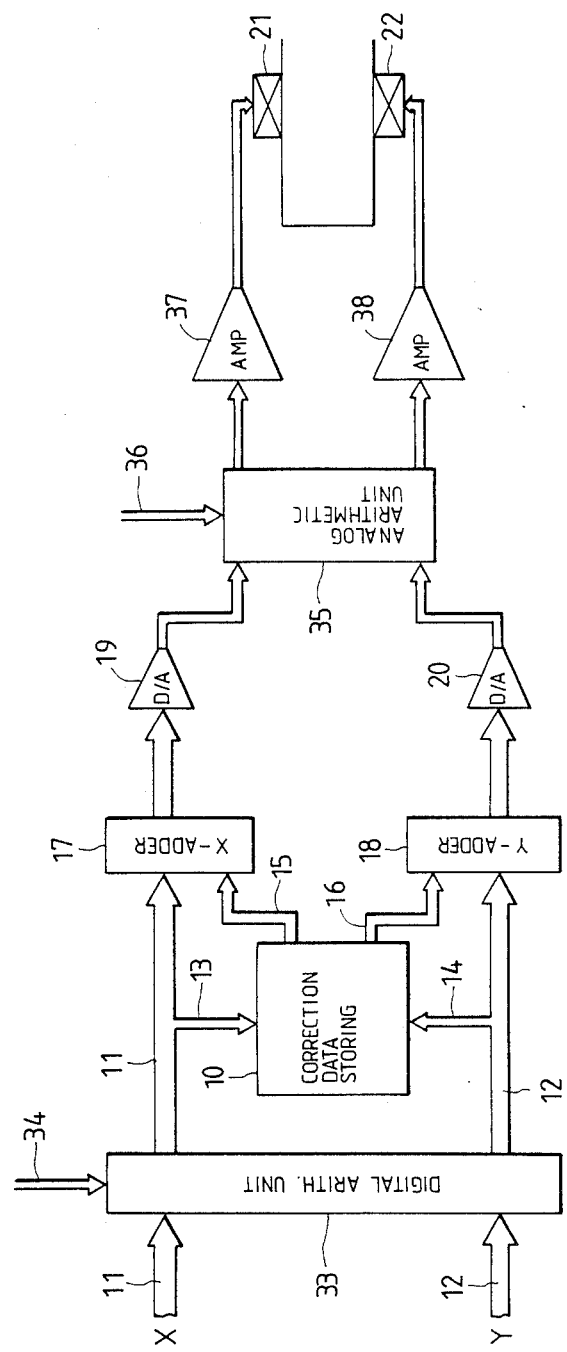
FIG. 2 is a schematic diagram showing an example of a deflection distortion correction device in an electron-beam exposure apparatus according to the present invention.

An embodiment of the present invention will be described with reference to FIG. 2 which is a schematic diagram showing an example of a correction device for correcting deflection distortion occurring in an electron-beam exposure apparatus according to the present invention. In FIG. 2, the same circuit components or elements as those in FIG. 1 bear the same reference numeral. Reference numerals 33 designates a digital arithmetic unit disposed on both the X-beam position data line 11 and the Y-beam position data line 12. The digital arithmetic unit 33 is adapted to have a cubic-function processing function, so that the beam position data in the X-axis direction and Y-axis direction are corrected based on either the cubic-function or an external control signal 34. The digital arithmetic unit 33 is provided in order to avoid unnecessary storage of correction data which can be expressed by the above described cubic function. An analog arithmetic unit 35 operates to subject the outputs of the D/A converters 19 and 20 to analog corrections based on either an external control signal 36 or a preset cubic-function processing function provided thereto. Further, reference numerals 37 and 38 designate power amplifiers for amplifying the outputs of the analog arithmetic unit 35 to drive the main deflection coils 21 and 22.

The operation of the embodiment shown in FIG. 2 will be described.

The beam position data which are supplied through the data lines 11 and 12 from either the pattern data storing unit or the pattern data generating unit (not shown), have an accuracy of N-bits in each of the X-axis and Y-axis directions. A deflection area is equally divided by $2^n$ (n is positive integer satisfying $n<N$) in both the X and Y directions to thereby obtain lattice pattern points of $(2^n+1)\times(2^n+1)$ as shown in FIG. 3(B). The correction data are measured at these correction data measurement (lattice pattern) points and then correction data of $2^n\times 2^n$ is obtained by deleting one column and one line in each of the X and Y directions, voluntarily. The correction data are then subjected to selection in the digital arithmetic unit 33 so as to remove the correction data that can be expressed by a cubic function therefrom. Thereafter, the remaining correction data are stored in the correction data storing unit 10. Upon an occurrence of beam deflection, the correction data is read out from the correction data storing unit 10, and then the correction data are supplied through the data output lines 15 and 16 to the X-adder 17 and the Y-adder 18, respectively, where the X-correction and Y-correction data are added to the X and Y position data to carry out the digital corrections. The outputs of the X-adder 17 and the Y-adder 18 are subjected to D/A conversion in the D/A converters 19 and 20 to be applied to the following analog arithmetic unit 35. In the analog arithmetic unit 35, analog signals are then subjected to the analog conversion based on either the external control signal 36 with respect to the deflection corrections or the preset cubic-function processing function.

In order to clarify the correction operation, concrete examples of a pattern after the analog correction and after the digital correction are illustrated in FIG. 3(B). While the order of the corrections is reversed in FIG. 3(B), the final or net result of the corrections is that obtained by the device constructed as shown in FIG. 2. The left part of FIG. 3(B) illustrates a square pattern having deflection distortion, that is a bobbin-shaped pattern, the middle part thereof illustrating an example of the pattern after the analog corrections and the right part thereof illustrating an example of the pattern after subjecting the analog-corrected pattern to digital correction. The pattern shown in the middle portion of FIG. 3(B) is obtained by subjecting the bobbin-shaped pattern to correction with respect to distortion that can be expressed by a cubic function. The pattern shown in the right part thereof is obtained by subjecting the pattern shown in the middle portion thereof to the digital correction.

As shown in the middle part of FIG. 3(B), there still remains distortion in the pattern. In this case, however, since the three-dimensional distortions which occupy the most part of the distortion have been corrected the occurrence of the distortions is suppressed for the most part. The correction pattern is then further subjected to the digital corrections as fine corrections. Consequently, the pattern shown in the right portion of FIG. 3(B) is obtained.

As is apparent from a comparison of FIGS. 3(A) and 3(B), according to the present invention, each of the edges of the square pattern is corrected smoothly.

With such a correction device as described above according to the present invention, where the deflection distortion is corrected by both the digital correction with a cubic-function processing and analog correction, assuming that the maximum in the correction amount of distortion that cannot be corrected based on the cubic-function could be reduced to 1/m of the maximum in the correction amount thereof in the conventional apparatus, it becomes possible to reduce the capacity of the correction data storing unit to $1/m^2$ of that in the conventional one without degrading the correction accuracy. Although the above described apparatus employs a single analog arithmetic unit 35, a plurality of arithmetic units having a variety of arithmetic functions may be employed in order to improve the correction accuracy.

According to the present invention, the correction operation of distortion which can be expressed by the cubic function and which occupies for the most part of the distortion, is shared to the analog arithmetic unit, and the remaining fine distortion is only measured actually to be stored in the correction data storing unit for the purpose of the digital fine correction. As a result, it is realized to make the correction data storing unit compact with maintaining the correction accuracy required.

What is claimed is:

1. An electron-beam exposure apparatus for exposing a substrate by an electron-beam in which beam position data in an X-axis direction and in a Y-axis direction which are supplied from a pattern data storing means or a pattern data generating means, are applied to an electron-beam deflection means (21, 22) after digital-to-analog conversion, comprising: means (33) for removing correction data which can be expressed as a cubic function, correction data storing means (10) for storing correction data other than data which can be expressed by a cubic function, adding means (17, 18) for adding the correction data from the correction data storing means to beam position data in both the X- and Y-axis directions; digital-to-analog converting means (19, 20) for subjecting output signals from the adding means to digital-to-analog conversion; and an analog arithmetic operation means (35) for subjecting outputs from the digital-to-analog converting means to analog correction based on either a deflection correction control signal (36) or a predetermined cubic-function, wherein the electron-beam deflection is corrected.

2. The electron-beam exposure apparatus as claimed in claim 1 wherein the removing means comprises a digital arithmetic unit for providing correction data other than the data that can be expressed by a cubic function, for correcting the beam position in the X-axis direction and in the Y-axis direction.

3. The electron beam exposure apparatus as claimed in claim 1 wherein said analog arithmetic operation means comprises a plurality of arithmetic means each having a different operation function.

* * * * *